United States Patent
Woods

(10) Patent No.: US 8,589,857 B2
(45) Date of Patent: *Nov. 19, 2013

(54) PWB VOLTAGE AND/OR CURRENT CALCULATION AND VERIFICATION

(75) Inventor: Jason Woods, Parker, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/422,890

(22) Filed: Mar. 16, 2012

(65) Prior Publication Data

US 2012/0180020 A1    Jul. 12, 2012

Related U.S. Application Data

(63) Continuation of application No. 12/617,667, filed on Nov. 12, 2009, now Pat. No. 8,161,451.

(51) Int. Cl.
*G06F 17/50* (2006.01)

(52) U.S. Cl.
USPC .......................................... 716/137; 716/100

(58) Field of Classification Search
USPC ................................. 716/100–102, 136–138
See application file for complete search history.

(56) References Cited

U.S. PATENT DOCUMENTS

| | | | |
|---|---|---|---|
| 6,845,491 B2 | 1/2005 | Miller et al. | |
| 8,161,451 B2 * | 4/2012 | Woods | 716/137 |
| 2005/0125751 A1 * | 6/2005 | Miller et al. | 716/4 |
| 2007/0226659 A1 | 9/2007 | Suaya et al. | |

* cited by examiner

*Primary Examiner* — Binh Tat
(74) *Attorney, Agent, or Firm* — Seed IP Law Group PLLC

(57) ABSTRACT

Disclosed is a layout tool that verifies the operability of a printed circuit board design. Electrical parameters may be calculated for wire traces that are laid out for a given design. Based on the voltage drop calculations and the voltage and current requirement of the various system components, the layout tool may determine if a given system component will remain within its required operating range. The layout tool may additionally be operable to verify proper spacing between traces that make up a differential signal and to verify that certain pins of integrated circuit are properly connected.

9 Claims, 4 Drawing Sheets

| | COMPONENTS | OPERATING RANGE (V) | OPERATING RANGE (I) |
|---|---|---|---|
| 304a | D1 | 100-200 mV | 1-2 mA |
| 304b | D2 | 100-200 mV | 3-4 mA |
| 304c | D3 | 100-200mV | 1-2 mA |
| 304d | D4 | 100-200mV | 5-6 mA |
| | POWER SOURCES | CURRENT SOURCING CAPACITY | OPERATING RANGE (V) |
| 308 | P1 | 800 mA | 50-250 mV |
| | WIRE TRACES | RESISTIVITY | MAXIMUM SIGNAL SPACING |
| 312 | PWR | 10 µR/m | — |
| 316 | DATA | 5 µR/m | 100 µm |

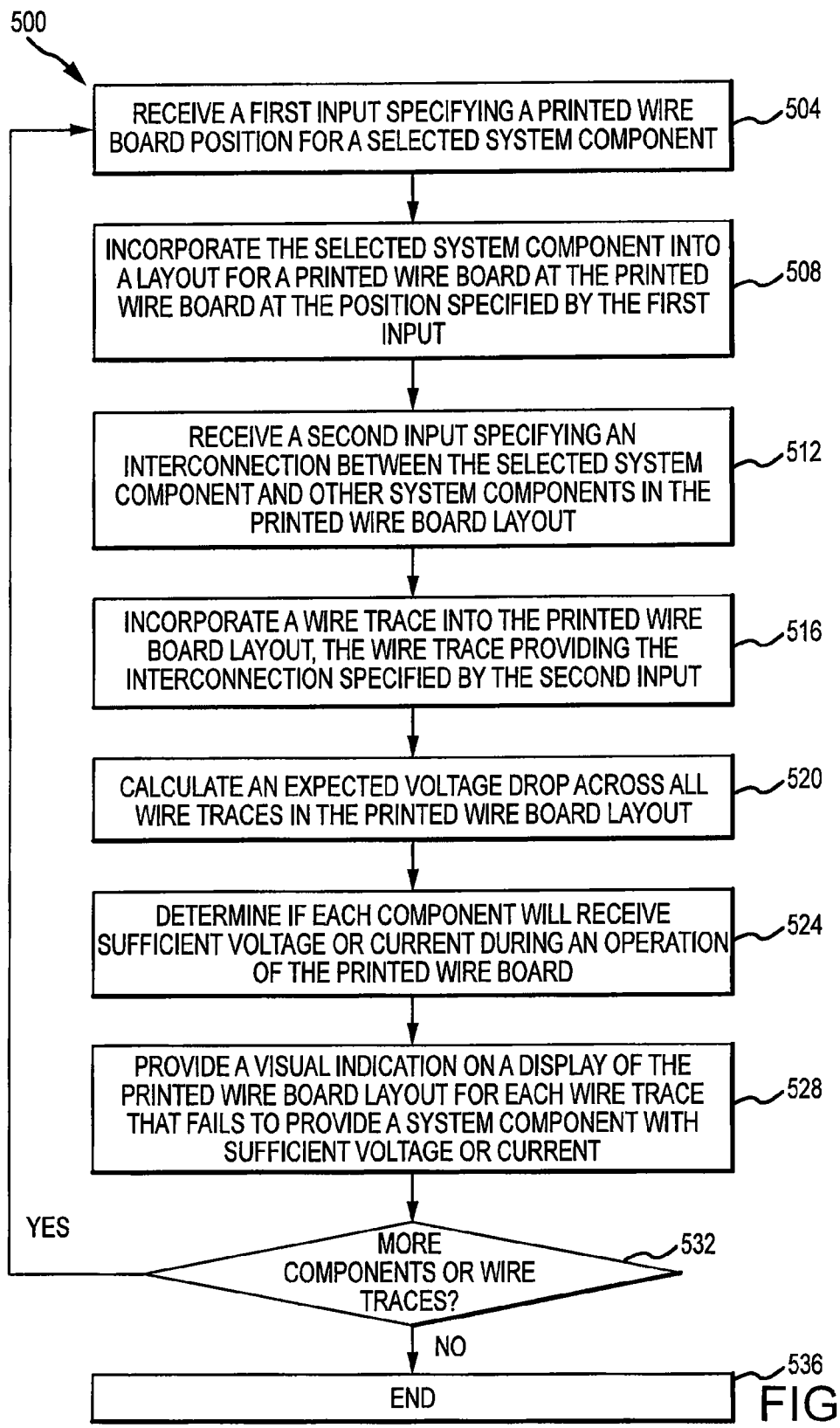

US 8,589,857 B2

PWB VOLTAGE AND/OR CURRENT CALCULATION AND VERIFICATION

CROSS REFERENCE TO RELATED APPLICATION

This application is a continuation of U.S. patent application Ser. No. 12/617,667, entitled "PWB Voltage and/or Current Calculation and Verification," filed on Nov. 12, 2009, now U.S. Pat. No. 8,161,451, which is hereby incorporated by reference herein in its entirety.

TECHNICAL FIELD

Embodiments discussed herein are directed to a layout tool for printed wire boards operable to calculate circuit operating conditions and to determine if the circuit will operate within acceptable parameters.

BACKGROUND

Printed wire boards are used to implement electronic systems or subsystems. A printed wire board includes a number of integrated circuits or components that are mounted on the surface of the board. The integrated circuits or other components are interconnected by wires or "traces" that are deposited or printed on the surface of the printed wire board. Electronic design automation is typically used to design a printed wire board. Electronic design automation may provide a graphical environment for building a system or subsystem from various lower level components. Once a system or subsystem has been designed, the system or subsystem's layout may be determined. Specifically, the orientation and location on the board is determined for the various system or subsystem components. One part of laying out a system or subsystem on a board is determining the location and placement of the wires or traces that interconnect the pins of the various integrated circuits or other components. A layout tool is a type of electronic design automation component that is used to determine the placement of circuit components and wire traces on a printed wire board.

SUMMARY

Embodiments discussed herein are directed to a layout tool that verifies the operability of a printed circuit board design. Electrical parameters may be calculated for wire traces that are laid out for a given design. Resistivity values may be used in combination with length and width values of individual traces to calculate the voltage drop across the trace for a given current load. The layout tool also includes electrical parameters for the integrated circuits and other components used in a printed circuit board design. Based on the voltage drop calculations and the voltage and current requirement of the various system components, the layout tool may determine if a given system component will remain within its required operating range. The layout tool may additionally be operable to verify proper spacing between traces that make up a differential signal and to verify that certain pins of integrated circuit are properly connected.

One embodiment is directed to a printed wire board layout tool, comprising: a component database having a plurality printed wire board component records, each record having operating parameters for a corresponding printed wire board component; a layout module in communication with the component database, the layout module having a graphical environment for producing a design for a printed wire board from components selected from the component database and connected through wire traces; and a design check module in communication with the layout module and the component database, the design check module operable to import operating parameters for each component in the printed wire board design from the component database and to calculate electrical parameters of the wire traces based on their dimensions; wherein the design check module is further operable to identify a potential failure point in the design based on the operating parameters of the components and based on the electrical parameters of the wire traces and to display a visual indication of the failure point in the graphical environment.

Another embodiment is directed to a method, in an electronic design environment having one or more modules tangible embodied in a computer readable storage medium and running on a processor, of determining the operability of a printed wire board design, the method comprising: receiving, by first module from a second module, a layout for a printed wire board that specifies printed wire board positions for one or more system components and printed wire board positions for one or more wire traces that interconnect the system components; calculating, by the first module, an expected voltage drop across each wire trace based on operating parameters associated with each system component and based on electrical parameters of the wire traces; determining, by the first module, if each system component will receive sufficient voltage or current during an operation of the printed wire board based on operating parameters associated with each system component and based on the expected voltage drop across each trace; and displaying a visual indication on a display of the printed wire board layout for each wire trace that fails to provide a system component with sufficient voltage or current.

Yet another embodiment is directed to a method, in an electronic design environment having one or more modules tangible embodied in a computer readable storage medium and running on a processor, of determining the operability of a printed wire board design, the method comprising: receiving, from a user input device, a first input specifying a printed wire board position for a selected system component; in response to the first input, incorporating, by a first module, the selected system component into a layout for a printed wire board at the printed wire board position specified by the first input; receiving, from a user input device, a second input specifying an interconnection between the selected system component and other system components in the printed wire board layout; in response to the second input, incorporating, by the first module, a wire trace into the printed wire board layout, the wire trace providing the interconnection specified by the second input; in response to incorporating the wire trace, calculating, by a second module, an expected voltage drop across all wire traces in the printed wire board layout based on operating parameters of the system components and based on electrical parameters of the wire traces; determining, by the second module, if each component will receive sufficient voltage or current during an operation of the printed wire board based on operating parameters associated with each component and based on the calculated voltage drop across each wire trace; and displaying a visual indication, on an output device, for each wire trace that fails to provide a system component with sufficient voltage or current.

BRIEF DESCRIPTION OF THE DRAWINGS

FIG. 5 is another flow chart illustrating a method in accordance with implementations discussed herein.

DETAILED DESCRIPTION

In one embodiment, a system is disclosed for determining the operability of printed wire boards designs. The system includes a graphical user environment which in one aspect may provide a mechanism for building a system or subsystem to be implemented on a board. As a final product, the printed wire board may include a number of integrated circuits, transistors or other components mounted on the surface of the board. The various system components are interconnected through printed wire traces on the surface of the board.

In the design phase of building the printed wire board, a representation of the board layout may be graphically displayed in an electronic design environment. In the electronic design environment, the printed wire board may include a number of cells that represent such board components as integrated circuits, transistors, power sources and so on. By manipulating the cells, a system designer may add or remove various components and connect or disconnect the components. Each component or system cell may be associated with certain electrical parameters which allow the system's operation to be simulated. Through such a simulation the system's operability may be verified.

In one embodiment, a measure of the printed wire board's operability is whether or not integrated circuits or other components of the system are provided with current and voltage amounts that are within the appropriate component specifications. This and other measures of the printed wire board's operability are discussed herein.

As used herein, operating parameters may refer to such quantities as minimum and maximum voltage requirements, minimum and maximum amperage requirements, and/or nominal voltage and amperage quantities. In addition to operating parameters for integrated circuits and other system components, printed wire board operability may be determined by the calculations based on wire trace electrical characteristics. Such characteristics may be computed or calculated from known resistivity values and based on wire trace dimensions, such as wire trace width and wire trace length.

Figure 1:
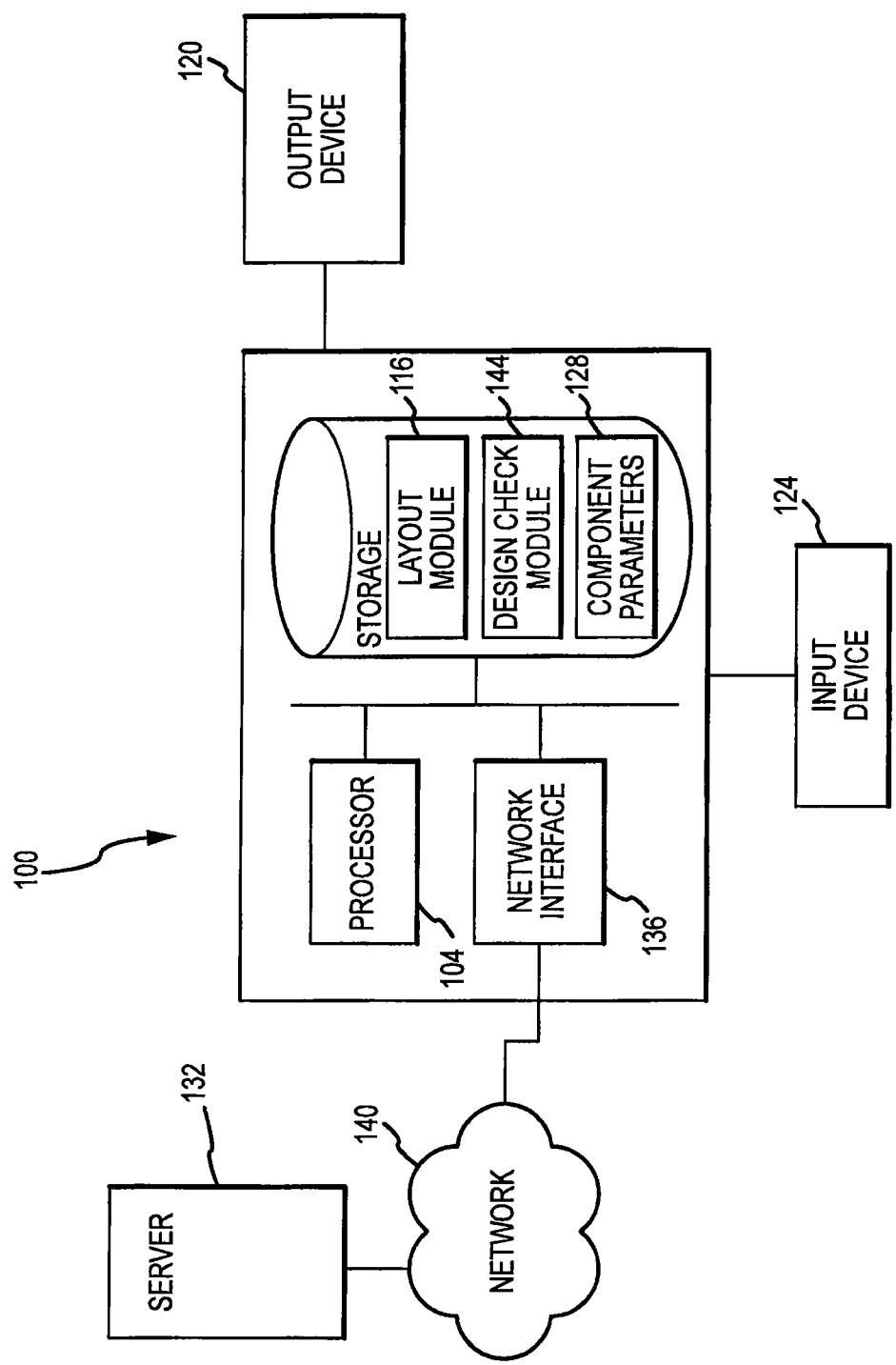
FIG. 1 is an illustration of an operating environment showing components and features of implementations discussed herein.

Turning now to FIG. 1, a system in accordance with embodiments discussed herein is generally identified with reference number 100. The system 100 may include a processor 104 provided in association with a storage device 108, such as magnetic or optical storage. The storage device 108 may be volatile or non-volatile memory, implemented using any suitable technique or technology such as, for example, random access memory (RAM), disc storage, flash memory, solid state, and so on. The processor 104 may be operable to run executable code associated with a module, file, or application which is stored on the storage device 108. As used herein a module includes processor executable code that may be run to carry out one or more functions in connection with verifying the operability of a printed wire board. "Processor executable code" includes any computer-readable media or commands that may be ultimately interpreted by a processor such as HTML or XML files that are rendered into user-viewable applications by an application executed by the processor 104.

As shown in FIG. 1, the system 100 includes a layout module 116. The layout module 116, when running on the processor 104, implements an electronic design environment. The electronic design environment implemented by layout module 116 provides a graphical mechanism for a user to design a system or a subsystem that is to be implemented on a printed wire board. Through the operation of the layout module 116, the user may select one or more components and place the components in a circuit arrangement which is displayed in the electronic design environment. The layout module 116 additionally allows the user to specify interconnections between the various selected components.

The system 100 may include an output device 120. The output device 120 may be a computer monitor, workstation monitor, television, or other visual display device. Through the operation of the output device 120, the layout module 116 may display its electronic design environment. Additionally, the system 110 may include an input device 124. The input device 124 may include any device operable to receive input from a user and to convey the input to the system 100. A user input device may be an alphanumeric keyboard or a pointing device such as mouse that allows the user to control the position of a cursor that is displayed on the output device 120. In some cases the user input device 124 may include a track ball or guide plane that may be manipulated to control cursor movements. Through the operation of the input device 124 the user may, among other uses, select various components to be included in a printed wire board layout.

The layout module 116 may be provided in association with a component database 128. The database 128 includes records or other entries for a plurality of system components usable in a printed wire board design. The database 128 may provide data in both design and verification stages. In the design stage the layout module 116 may query the database 128 for a list of available system components. In response to database queries, the layout module 116 may receive a list of available system components for selection by a user in connection with the user's building of a system or subsystem in the electronic design environment. Entries or records in the database 128 may include such information as a component identifier. In addition to a component identifier, a particular record may include electronic or operating parameters associated with the corresponding system component. Such parameters may include, for example, operating voltage and/or current values. The current and voltage values may be specified as ranges within which the system component operates under both heavy and light loading conditions. Additionally, nominal operating values for voltage and current may be provided.

The database 128 may be stored in the storage device 108. The component database 128 may additionally be updated with additional components or component data from a remote server 132. In this regard, the system 100 may additionally include a network interface 136 operable to send communications across a network 140. In accordance with certain embodiments discussed herein, the network interface 136 may include a modem. Using a modem, the system 100 may communication over the network 140. In one embodiment, the network 140 includes standard telephone lines associated with the public switched telephone network (PSTN). The network 140 may include any type of network capable of data communication, such as for example, a local or wide area network, cell phone network or the Internet. In this regard, the system 100 may communicate through the network interface 136 using any suitable communication protocol such as TCP/IP. The network interface 136 may be used to facilitate communication between the system 104 and a central remote server 132.

The system 100 additionally includes a design check module 144. The design check module 144 is operable to verify the operability of a printed wire board design which is designed through the operation of the layout module 116. In one embodiment, the design check module 144 receives a completed printed wire board design from the layout module 116 and thus verifies its operation following the completion of the design stage. In another embodiment, the design check module 144 may monitor the design process concurrently and provide an indication of possible errors in the design while the printed wire board design is being constructed. The design check module 144 may be in communication with the component database 128. Through queries submitted to the component database 128, the design check module 144 acquires operating parameter data associated with system components used in the printed wire board design. Using such operating parameters, the design check module 144 may verify the functionality or operability of the printed wire board design.

The operation of the design check module 144, will be explained in context of the electronic design environment 200, shown in FIG. 2 as a screen shot of the output device 120. The electronic design environment shown in FIG. 2 includes an example layout 202 for a printed wire board design. The layout 202 includes a power source 204. The power source 204 is connected to a connection to wire trace 208, which provides power to components D1, D2, and D3. The wire trace 208 includes wire trace segment 216, which provides a connection to device D1; wire trace segment 220, which provides a connection to device D2; and wire trace segment 224, which provides a connection to device D3.

In one embodiment, the design check module 144 simulates the design 200 and calculate the voltage drop across various parts of the wire trace 208. In so doing, the design check module may use worst case operating conditions when calculating voltage drops across wire traces. In using worst case operating conditions the design check module, checks the design under the operating conditions that are most likely to led to a failure. In determining worst case operating conditions, the design check module may use operating parameters associated with each system component. For example, in determining the voltage drop across the wire segment 216, the design check module 144 may consider the maximum possible current demanded by the component D1 and the current sourcing capacity of the power source 204. With the amount of current provided to the component D1 known, Ohm's law may be used to determine voltage drop across a wire trace segment using resistance values calculated from wire trace dimensions. Specifically, length and width the values for a wire trace, in combination with known resistivity values for the material used in the trace, may be used to determine the resistance of a particular wire trace.

With the voltage drop across a wire trace known, the design check module 144 may determine if the voltage delivered to a component, such as component D1 is within acceptable operating parameters which are necessary for the device to function properly. This process may be iteratively repeated for the various system components that are connected at various places to the wire trace 208. In so doing, the design check module 144 may determine that certain components which are distally located with respect to the power source fall below required operating ranges. Specifically, the design check module 144 may determine that the voltage drop across certain wire traces provides an insufficient voltage or, more particularly, provides a voltage which is below the required operating range for a certain component.

If the design check module 144 determines that one or more components will be provided with insufficient voltage or current, the design check module 144 may display a visual indication of such a failure point in the graphic design environment. For example, as shown in FIG. 2, a portion of the wire trace 224 is highlighted by a shaded area 228. The shaded area 228 indicates a failure or potential failure point in the printed wire board design 200. Specifically, the shaded area 228 indicates that the wire trace 224 fails or will likely fail to provide sufficient voltage and/or current to the component D3.

In one embodiment, the design check module 144 may verify proper spacing between differential signal wire traces. In order for a printed wire board design to function properly, differential signal wire traces should remain within proper spacing limits. Differential signal wire traces that exceed a certain maximum spacing will have an improperly high impedance value. With an improperly high impedance value, a differential signal wire trace will not properly carry a differential signal between integrated circuits or other system components. Accordingly, the design check module 144 may measure spacing between differential signal wire traces at a plurality of points along the path taken by the differential signal wire traces. If the design check module 144 determines that the maximum spacing has been exceeded, an indication of this fact may be displayed in the graphical design environment. Specifically, as shown in FIG. 2, the differential wire traces 132a,b are improperly spaced. This improper spacing is highlighted by the design check module 144 through the shaded area 236.

The design check module 144 may also verify connections between integrated circuit pins and certain wire traces. Errors in printed wire board designs may occur, for example, if wire traces that carry power are improperly connected to non-power pins, such as signal pins. In this regard, the design check module 144 may examine connections between components to discover improperly made connections. As shown in FIG. 2, the device D4 is improperly connected to the power source 204 through the trace 240. This improper connection may be discovered by the design check module 144, and this fact indicated by the shaded area 244.

Figures 2, 3:
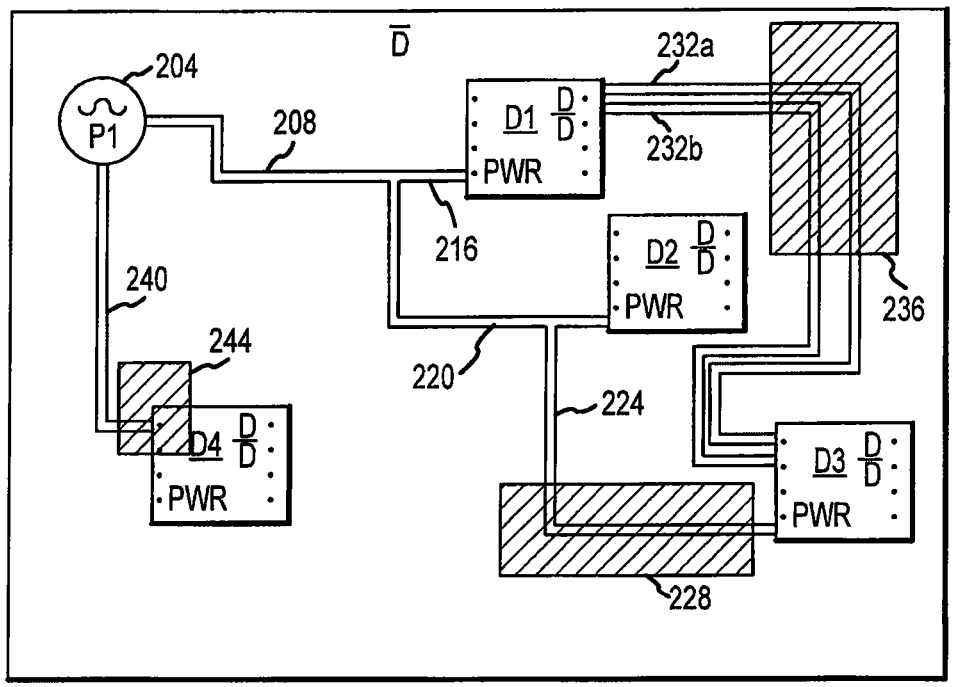
FIG. 2 is an illustrations of a display device output.
FIG. 3 is an illustration of a component database entries.

In FIG. 3 a number of component database 128 entries are shown. FIG. 3 includes entries 304a-d, which provide operating parameters for components D1 through D4. Database entries 304a-d include operating voltage and current ranges for components D1-D4. Additionally, FIG. 3 includes entry 308 for the power source 204. Entry 308 includes a value for the current sourcing capacity and voltage operating range for the power source 204. FIG. 3 also includes entries 312 and 316 for certain wire traces. Entry 312 includes data for wire traces that supply power, such as wire trace 204. Entry 316 includes data for data wire traces that carry data, such as wire traces 232a,b. the operating parameters shown in FIG. 3 may be imported by the design check module 144 in connection with verifying the operation of a printed wire board design.

Figure 4:
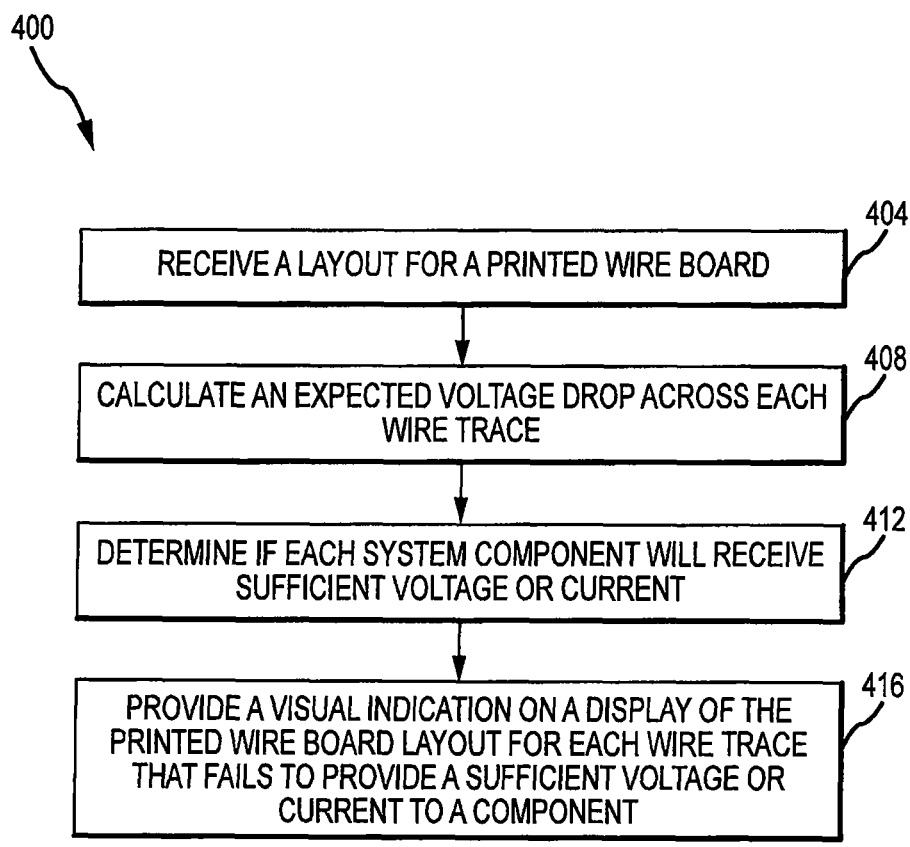
FIG. 4 is a flow chart illustrating a method in accordance with implementations discussed herein.

In FIG. 4 an operation of the design check module 144 is illustrated by flow chart 400. The method illustrated in FIG. 4 is an operation of the design check module 144 which verifies a completed design for a printed wire board. Initially in operation 404, the design check module 144 receives a layout for a printed wire board. In one embodiment, the design check module 144 receives the layout from the layout module 116. Following operation 404 operation 408 may be executed.

In operation 408, the design check module 144 calculates an expected voltage drop across each wire trace in the printed wire board design. In so doing, the design check module 144 may import offering parameters associated with various system components from the component database 128. Such operating parameters may include voltage or current ranges and/or resistivity values for certain wire traces. Following operation 404, operation 416 may be executed.

In operation 416, the design check model 144 may determine if each system component in the design will receive sufficient voltage or current. In so doing, the design check model 144 may determine if the voltage supplied by the wire trace is sufficient to provide a voltage within the required operating range for each system component. Following operation 416, operation 420 may be executed. In operation 420 the design check module 144 may provide a visual indication on a display of the printed wire board layout for each wire trace that fails to produce a sufficient voltage for current to a system component. The visual indication may include shading, highlighting or other display mechanism that emphasize the area in the wire board design likely to fail when the system operates.

FIG. 5 is a flow chart of illustrating a method in accordance with implementations discussed herein. The method illustrated by FIG. 5 is an operation of the design check module 144 that monitors the layout module 116 as the layout module 116 is used to build a particular printed wire board design. Initially, in operation 504, the design check module 144 receives a fiRst input specifying a printed wire board position for a selected system component. Specifically, a user, through the operation of the user input device 124, selects a certain system component from the component database 128 and places the component at a certain location with a printed wire board design. Following operation 504, operation 508 may be executed. In operation 508, the design check module 144 incorporates the selected system components into a layout for a printed wire board at the printed wire board positions specified by the first step. Following operation 508, operation 512 may be executed.

In operation 512, the design check module 144 receives a second input specifying an interconnection between the selected system component and other system components in the printed wire board layout. For example, the user may input certain commands through the user input device 124 which indicate an interconnection between the selected system component and other system components associated with the printed wire board design. With reference to FIG. 3, the user may employ the user input device 124 to draw or otherwise provide a trace 232a,b from differential signal outputs in the device D1 to the differential signal inputs in device D3. Following operation 512, operation 516 may be executed.

In operation 516, the design check module 144 incorporates a wire trace into the printed wire board layout. The wire trace layout incorporated in operation 516 provides the interconnection specified by the second user input. Following operation 516, operation 520 may be executed.

In operation 520, the design check module 144 calculates an expected voltage drop across all wire traces in the printed wire board layout. In calculating voltage drops, the design check module 144 may import operating parameters from the component database 128. In operation 520, the design check module 144 calculates voltage drops for the added wire trace. In addition to this, because the newly added wire trace may have an effect on other parts of the printed wire board design, voltage drops across all wire traces may be calculated. Following operation 520, operation 524 may be executed.

In operation 524, the design check module 144 may determine if each component will receive sufficient voltage or current during an operation of the printed wire board. Specifically, the design check module 144 may determine if the various components will be supplied with current and/or voltage within required operating parameters. Following operation 524, operation 528 may be executed.

In operation 528 the design check module 144 may provide a visual indication on a display of the printed wire board layout for each trace that fails to provide a system component with sufficient voltage and/or current. In so doing, the design check module 144 may display shading, highlighting, or other visual indication which specifies the portion of the wire board design which is anticipated to fail. Following operation 528, operation 532 may be executed.

In operation 532 a determination is made as to whether additional components or traces will be added to the printed wire board design. If additional components or wire traces are to be added, operation 504 may follow operation 532. If no additional components or wire traces are to be added, operation 536 may follow operation 532 and operation 536, and the method 500 may end.

The foregoing merely illustrates certain principles of aspects of the invention with reference to implementations that conform to inventive concepts. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustration only and are not intended to limit the scope of the present invention. References to details of particular embodiments are not intended to limit the scope of the invention.

The invention claimed is:

1. In an electronic design environment, a method of determining the operability of a printed wire board design, the method comprising:

receiving a layout for a printed wire board that specifies printed wire board positions for one or more system components and printed wire board positions for one or more wire traces that interconnect the system components;

calculating, in a processor, an expected voltage drop across each wire trace based on operating parameters associated with each system component and based on electrical parameters of the wire traces;

determining, in the processor, if each system component will receive sufficient voltage or current during an operation of the printed wire board based on operating parameters associated with each system component and based on the expected voltage drop across each trace; and displaying, on a display, a visual indication of the printed wire board layout for each wire trace that fails to provide a system component with sufficient voltage or current.

2. The method of claim 1, wherein the printed wire board layout includes a component having a differential signal, further comprising:

based on the printed wire board layout, calculating a distance between a first and a second wire trace at a plurality of points, wherein the first and second wire trace carry the differential signal; and providing a visual indication on the display of the printed wire board layout for each point where the distance between the first and the second wire trace exceeds a predetermined distance.

3. The method of claim 1, wherein the printed wire board layout includes a component having a power pin and a signal pin, the method further comprising:

based on the printed wire board layout, determining all wire trace connections between a power source and a component;

providing a visual indication on the display of the printed wire board for signal pin that is connected to the power source through a wire trace.

4. The method of claim 1, further comprising:

extracting a plurality of component identifiers from the printed wire board layout;

sending a query to a database, the query including the component identifiers; and receiving operating parameters for each component from the database.

5. The method of claim 1, wherein the operating parameters include at least one of a maximum voltage, minimum voltage, a minimum current and a maximum current.

6. The method of claim 1, wherein the operating parameters for each power source include a current sourcing capacity.

7. The method of claim 1, wherein the database is stored in the storage medium and updated by network transactions sent across a network to a remote database.

8. A method of determining the operability of a printed wire board design in an electronic design environment having one or more modules tangibly embodied in a computer readable storage medium and executable by a processor to execute instructions, the instructions comprising:

receiving, from a user input device, a first input specifying a printed wire board position for a first system component;

in response to the first input, incorporating, by a first module implemented in the processor, the first system component into a layout for a printed wire board at the printed wire board position specified by the first input;

receiving, from the user input device, a second input specifying an interconnection between the first system component and a second system component in the printed wire board layout;

in response to the second input, incorporating, by the first module implemented in the processor, a wire trace into the printed wire board layout, the wire trace providing the interconnection specified by the second input;

in response to incorporating the wire trace, calculating, by a second module implemented in the processor, an expected voltage drop across at least one wire trace in the printed wire board layout based on operating parameters of the system components and based on electrical parameters of the at least one wire trace;

determining, by the second module, if at least the first and second component will receive sufficient voltage or current during an operation of the printed wire board based on operating parameters associated with at least the first and second component and based on the calculated voltage drop across the at least one each wire trace; and displaying, on an output device, a visual indication for each wire trace that fails to provide a system component with sufficient voltage or current.

9. The method of claim 8, wherein the visual indication include a shaded area overlain on a graphical representation of the printed wire board design.

\* \* \* \* \*